United States Patent
Schloesser et al.

(10) Patent No.: US 8,722,523 B2
(45) Date of Patent: May 13, 2014

(54) SEMICONDUCTOR DEVICE COMPRISING SELF-ALIGNED CONTACT ELEMENTS AND A REPLACEMENT GATE ELECTRODE STRUCTURE

(75) Inventors: Till Schloesser, Dresden (DE); Peter Baars, Dresden (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 20 days.

(21) Appl. No.: 13/371,049

(22) Filed: Feb. 10, 2012

(65) Prior Publication Data

US 2012/0211844 A1 Aug. 23, 2012

(30) Foreign Application Priority Data

Feb. 17, 2011 (DE) .......................... 10 2011 004 322

(51) Int. Cl.
*H01L 29/772* (2006.01)

(52) U.S. Cl.
USPC ........... 438/585; 438/303; 438/197; 438/290; 438/300; 257/E21.165; 257/E21.415; 257/E21.426; 257/330; 257/288

(58) Field of Classification Search
USPC ........... 257/288, 330, 369; 438/183, 216, 300
See application file for complete search history.

(56) References Cited

U.S. PATENT DOCUMENTS

| | | | |
|---|---|---|---|
| 6,063,676 A * | 5/2000 | Choi et al. ................. | 438/299 |
| 6,127,233 A * | 10/2000 | Rodder ..................... | 438/300 |
| 7,601,574 B2 * | 10/2009 | Pan .......................... | 438/183 |
| 7,871,915 B2 * | 1/2011 | Lim et al. ................. | 438/592 |
| 8,021,942 B2 * | 9/2011 | Wei et al. ................. | 438/216 |
| 2002/0008261 A1 * | 1/2002 | Nishiyama ................ | 257/288 |
| 2004/0169221 A1 * | 9/2004 | Ko et al. .................. | 257/330 |
| 2005/0090066 A1 * | 4/2005 | Zhu et al. ................. | 438/300 |
| 2006/0286729 A1 * | 12/2006 | Kavalieros et al. ....... | 438/183 |
| 2007/0108514 A1 * | 5/2007 | Inoue et al. ............... | 257/330 |
| 2008/0102571 A1 * | 5/2008 | Pan .......................... | 438/197 |
| 2009/0057769 A1 * | 3/2009 | Wei et al. ................. | 257/369 |
| 2010/0078728 A1 * | 4/2010 | Li et al. ................... | 257/369 |
| 2010/0081262 A1 * | 4/2010 | Lim et al. ................. | 438/479 |
| 2012/0104509 A1 * | 5/2012 | Matsumoto ............... | 257/369 |
| 2012/0122284 A1 * | 5/2012 | Kim et al. ................. | 438/287 |

FOREIGN PATENT DOCUMENTS

DE  102007041027 A1   3/2009 .......... H01L 21/8238

OTHER PUBLICATIONS

Translation of Official Communication from German Patent Office for German Patent Application No. 10 2011 004 322.5 dated Dec. 23, 2011.

* cited by examiner

*Primary Examiner* — Julio J Maldonado
*Assistant Examiner* — Jaehwan Oh
(74) *Attorney, Agent, or Firm* — Amerson Law Firm, PLLC

(57) ABSTRACT

When forming sophisticated semiconductor devices including high-k metal gate electrode structures, a raised drain and source configuration may be used for controlling the height upon performing a replacement gate approach, thereby providing superior conditions for forming contact elements and also obtaining a well-controllable reduced gate height.

23 Claims, 6 Drawing Sheets

SEMICONDUCTOR DEVICE COMPRISING SELF-ALIGNED CONTACT ELEMENTS AND A REPLACEMENT GATE ELECTRODE STRUCTURE

BACKGROUND OF THE INVENTION

1. Field of the Invention

The present disclosure generally relates to the fabrication of integrated circuits, and, more particularly, to the contact level of a semiconductor device, in which contact areas, such as drain and source regions, as well as gate electrode structures, are connected to the metallization system of the semiconductor device.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

On the basis of the field effect transistors, more complex circuit components may be composed, such as inverters and the like, thereby forming complex logic circuitry, embedded memories and the like. Due to the reduced dimensions, the operating speed of the circuit components has been increased with every new device generation, wherein, however, the limiting factor of the finally achieved operating speed of complex integrated circuits is no longer the individual transistor element but the electrical performance of the complex wiring system, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections or vertical connections, which are also referred to as vias. These interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, which connects, with one end, to a respective contact region of a circuit element, such as a gate electrode and/or the drain and source regions of transistors, and, with another end, to a respective metal line in the metallization layer and/or to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. Upon further shrinkage of the critical dimensions of the circuit elements in the device level, also the dimensions of metal lines, vias and contact elements have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level have to be provided with critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas, and thus the available area for the contact regions, is 100 nm and significantly less, thereby requiring extremely complex lithography and etch techniques in order to form the contact openings with well-defined lateral dimensions and with a high degree of alignment accuracy.

Consequently, any misalignments during the critical contact process may result in contact failures, for instance caused by short circuits or leakage paths formed between the gate and the contact elements connecting to the drain and source regions. Furthermore, in particular in densely packed device areas, the pronounced surface topography caused by the closely spaced gate electrode structures increasingly results in deposition-related irregularities when forming the interlayer dielectric material in the narrow spaces formed between the densely packed gate electrode structures. For example, corresponding voids may be generated upon depositing the dielectric material or material system and these voids may extend along the transistor width direction, thereby forming buried channels, which in turn may be filled with a conductive material upon forming the contact openings and filling the same with the contact metal. In this case, contact elements of neighboring active regions may be "connected" by any buried tungsten channels, thereby also resulting in a severe contact failure. In order to avoid such continuous buried tungsten channels, a dielectric material liner may be deposited after forming the contact openings in order to seal the contact openings with respect to any buried voids previously created during the critical interlayer dielectric material deposition. In this case, however, the lateral dimensions of the contact openings may further be reduced, thereby increasing the overall contact resistivity. Moreover, a reliable deposition of a thin liner material into the high aspect ratio contact openings may also represent a very critical process step, which may not be compatible in sophisticated semiconductor devices in which the gate length approaches 40 nm and less.

In addition to improving transistor performance by reducing the gate length of sophisticated field effect transistors, superior material systems may also be provided in the gate electrode structures in order to provide a desired high capacitive coupling between the electrode and the channel region, without unduly increasing the leakage currents. To this end, typically, so-called high-k dielectric materials are used, which are to be understood as dielectric materials having a dielectric constant of 10.0 and higher, so that, for a given layer thickness, a significantly higher capacitive coupling may be obtained compared to a silicon oxide-based gate dielectric layer of the same thickness. Moreover, since a desired adjustment of the transistor threshold voltage may no longer be compatible with the high-k dielectric material, additional work function metal species may have to be incorporated into the gate electrode structure, for instance in the form of lanthanum, aluminum, tantalum, titanium and the like, so as to adjust the transistor characteristics for complementary transistors, or generally for transistors of different threshold voltage requirements. Moreover, by providing a metal-containing highly conductive material in close proximity to the high-k dielectric material, the creation of a depletion zone may also be avoided, as is typically the case in conventional polysilicon/silicon oxide-based gate electrode structures. It turns out, however, that incorporating the complex material systems of the gate electrode structures in an early manufacturing stage, i.e., upon actually forming the gate electrode structures, is associated with a plurality of difficulties that essentially arise from the fact that these sophisticated materials may significantly alter their characteristics when exposed to typical process conditions during the further processing of the device. Consequently, in some very promising approaches, process strategies have been developed in which the gate electrode structures may be provided as substantially conventional structures comprising polysilicon and a silicon oxide-based material, on the basis of which the basic transistor configuration is completed and, after any high temperature processes, the polysilicon material, possibly in combination with the dielectric material, is replaced by a complex material system comprising the high-k dielectric material, the work function metal species and typically a highly conductive electrode metal, such as aluminum and the like. In such replacement gate approaches, typically, a portion of the interlayer dielectric material is provided in order to passivate the transistors during the replacement of a polysilicon material, a top surface of which is exposed during a complex removal process. After the removal of the silicon material and the incorporation of the desired material system, a contact regime is applied which has to take into account the high-k metal gate electrode structure and the corresponding manufacturing requirements. Consequently, the critical process of forming contact elements may have to be compatible with a replacement gate approach when forming semiconductor devices comprising a highly complex logic circuit portion.

In view of the situation described above, the present disclosure relates to manufacturing techniques and semiconductor devices in which contact structures may be formed so as to comply with the requirements of a replacement gate approach, while additionally avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which sophisticated high-k metal gate electrode structures may be provided on the basis of a replacement gate approach in which appropriate raised drain and source areas or portions thereof may be used to adjust a final height of the gate electrode structures so as to provide superior process conditions upon forming contact elements that may connect to the gate electrode structures and the raised drain and source regions. The raised drain and source regions may, in some illustrative embodiments disclosed herein, be provided in a substantially self-aligned manner, at least with respect to the gate electrode structure along a transistor length direction, thereby significantly reducing the probability of creating contact failures caused by misalignment and buried tungsten channels, as may be the case in conventional strategies.

One illustrative method disclosed herein comprises forming a conductive material laterally adjacent to a placeholder gate electrode structure that is formed on an active region of a semiconductor device, wherein the conductive material extends to a height level that is less than a height level of a top surface of the placeholder gate electrode structure. The method further comprises performing a removal process in the presence of the conductive material so as to reduce a height of the placeholder gate electrode structure and to form an exposed top surface of a placeholder material of the placeholder gate electrode structure. Additionally, the method comprises replacing the placeholder material at least with a metal-containing electrode material so as to form a high-k metal gate electrode structure.

A further illustrative method disclosed herein comprises forming a dielectric stop layer above raised drain and source areas and above a placeholder gate electrode structure of a semiconductor device. Furthermore, the method comprises reducing a height of the placeholder gate electrode structure by using the stop layer formed above the raised drain and source areas so as to adjust a final height of the placeholder gate electrode structure and so as to expose a top surface of a placeholder material thereof. Moreover, the method comprises replacing the placeholder material having the exposed surface with at least a conductive electrode material so as to form a high-k metal gate electrode structure.

One illustrative semiconductor device disclosed herein comprises a high-k metal gate electrode structure formed on an active region and comprising a high-k dielectric material and an electrode metal, wherein a top surface of the high-k metal gate electrode structure extends to a gate height level. The semiconductor device further comprises a raised drain region and a raised source region formed laterally adjacent to the high-k metal gate electrode structure and connecting to the active region, wherein a top surface of the raised drain and source regions extends to a contact height level that differs from the gate height level by 20 nm or less. Furthermore, the semiconductor device comprises contact elements connecting to the raised drain and source regions, respectively, wherein the contact elements are formed in a dielectric material formed above the high-k metal gate electrode structure and the raised drain and source regions.

BRIEF DESCRIPTION OF THE DRAWINGS

The disclosure may be understood by reference to the following description taken in conjunction with the accompanying drawings, in which like reference numerals identify like elements, and in which.

Figure 1A:
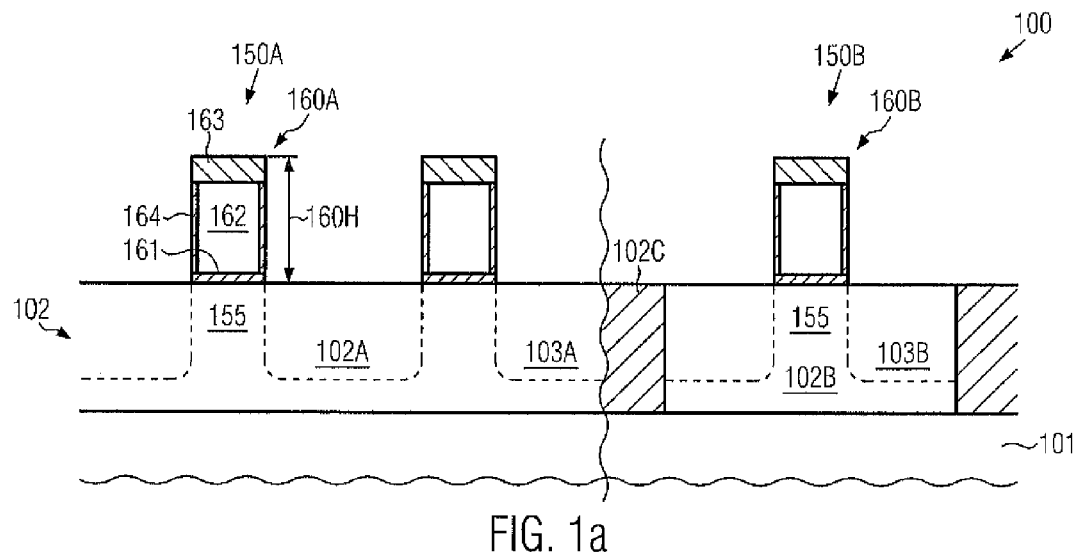
FIGS. 1a-1b schematically illustrate cross-sectional views of a semiconductor device during various manufacturing stages when forming a raised drain and source configuration having an appropriate height so as to control the final height level of a high-k metal gate electrode structure, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which superior process conditions upon forming contact elements may be provided by using a raised drain and source configuration, which is also used for adjusting the final height of a high-k metal gate electrode structure upon performing a replacement gate approach. To this end, an appropriate conductive material, such as a semiconductor material in the form of a semiconductor alloy, a substantially pure semiconductor material and the like, a metal-containing material and the like, may be provided on at least a portion of the drain and source areas, for instance, prior to actually completing the basic transistor configuration or after having performed any high temperature processes, in order to provide a highly conductive electrical connection to the actual drain and source regions within the active regions of the transistors. For example, in some illustrative embodiments, a semiconductor material may be formed, for instance, by epitaxial growth techniques and the like, for example, in a substantially "self-aligned" manner, i.e., by using selective deposition techniques, so that a desired height level is obtained. Thereafter, if required, a lateral patterning of the conductive material may be accomplished, while in other cases the self-aligned nature of the conductive material in some illustrative embodiments may not require any further lateral restriction of the material for forming the raised drain and source configuration. The conductive material, and in some illustrative embodiments a corresponding dielectric stop material formed thereon, may then be used for appropriately controlling the reduction in height of the placeholder gate electrode structures so that superior uniformity may be accomplished upon adjusting the final gate height. In particular, a generally reduced gate height may be selected by appropriately adjusting the height level of the raised drain and source configuration, thereby reducing the parasitic capacitance of the gate electrode structures. Thereafter, the placeholder material may be efficiently replaced by the desired complex material system for the high-k metal gate electrode structures, wherein also the reduced gate height may result in superior process conditions, for instance, with respect to filling in the high-k dielectric material, the work function metal species and a highly conductive electrode metal. Consequently after performing the replacement gate approach, the resulting high-k metal gate electrode structures and the raised drain and source regions may have a very similar height, for instance differing by 20 nm and significantly less, for instance 10 nm and less. The subsequent processing for forming the actual contact element may be based on significantly less critical process conditions so that, in some illustrative embodiments, a single lithography and patterning process sequence may be sufficient for forming contact elements connecting to the raised drain and source areas and to the high-k metal gate electrode structures. The contact elements may be formed on the basis of any appropriate material, for instance based on highly conductive metals, such as copper, silver, aluminum and the like, while other materials may also be used, such as tungsten and the like, depending on the overall process and device requirements.

FIG. 1a schematically illustrates a semiconductor device 100 in an early manufacturing stage. As shown, the device 100 may comprise a substrate 101, such as a semiconductor substrate or any other appropriate carrier material for forming thereon or thereabove a semiconductor layer 102, such as a silicon-based material, a silicon/germanium material and the like. It should be appreciated that the semiconductor layer 102 may represent a substantially continuous semiconductor material in an initial stage, while in the manufacturing stage shown in FIG. 1a, a plurality of semiconductor regions or active regions may be formed therein, which may be laterally delineated by appropriate isolation structures. For convenience, the semiconductor regions 102A, 102B are illustrated in combination with an isolation region 102C. Generally, an active region is to be understood as a semiconductor region in and above which one or more transistor elements are to be formed. For example, one or more transistors 150A are to be formed in and above the active region 102A and one or more transistors 150B are to be formed in and above the active region 102B. The transistors 150A, 150B may represent transistors of inverse conductivity type or generally transistors which may require different transistor characteristics, for instance with respect to threshold voltage and the like. In the manufacturing stage shown, the transistors 150A, 150B may comprise respective gate electrode structures 160A, 160B comprising, for instance, a placeholder material 162, such as a polysilicon material, possibly in combination with a dielectric cap layer or cap layer system 163 and a liner 164. In this manufacturing stage, the gate electrode structures 160A, 160B may have a gate height 160H which is to be understood as the height with respect to the surface of a portion of the active regions 102A, 102B (the portion may also be referred to as a channel region 155). Furthermore, as previously discussed, a length of the gate electrode structures 160A, 160B may be 40 nm and less in sophisticated applications. In FIG. 1a, the channel length is to be understood as the horizontal extension of the placeholder material 162, wherein the corresponding gate length may be slightly reduced in a later manufacturing stage when performing a replacement gate approach.

The semiconductor device 100 as shown in FIG. 1a may be formed on the basis of any appropriate process strategy. That is, the isolation region 102C may be formed on the basis of sophisticated lithography, etch, deposition, anneal and planarization techniques, thereby also laterally delineating the active regions 102A, 102B. After incorporating a desired basic dopant concentration into the active regions 102A, 102B, the processing may be continued by forming the gate electrode structures 160A, 160B, which may include sophisticated lithography processes and patterning strategies for providing the required material system and patterning the same. For example, the cap layer 163 used as an efficient hard mask material may be preserved if the actual placeholder material 162 may have to be protected during at least some further process phases. After patterning the materials 162, 161, the liner 164, if required, may be formed, possibly in combination with additional spacer elements (not shown), if considered appropriate for the further processing. In some illustrative embodiments, in one or both of the active regions 102A, 102B, corresponding cavities 103A, 103B may be formed by appropriate etch techniques in order to incorporate therein a semiconductor material for enhancing overall performance of the transistors 150A, 150B, respectively. To this end, well-established etch strategies may be applied so as to form the cavities 103A and/or 103B so as to have any desired shape and size. For example, a strain-inducing semiconductor alloy may be incorporated in the cavities 103A and/or 103B in order to enhance charge carrier mobility in the corresponding channel region 155. It is well known that certain strain conditions in the channel regions 155 may result in superior transistor performance, for instance for a standard crystallographic configuration, a compressive strain in the channel regions 155 may result in a superior hole mobility, while a tensile strain may result in increased electron mobility. For example, in P-channel transistors, a silicon/germanium alloy or any other semiconductor mixture having a natural lattice constant that is greater than the lattice constant of the base material of the active region may be incorporated in order to obtain a compressive strain condition in the channel region 155. On the other hand, a silicon/carbon material and the like, which may have a reduced natural lattice constant compared to the base material, may result in a tensile strain in the channel region 155. A corresponding semiconductor material may be efficiently incorporated on the basis of selective epitaxial growth techniques, wherein one of the active regions 102A, 102B may be covered by an appropriate mask material, when different types of semiconductor material are to be provided for the devices 150A, 150B. In other cases, any such performance enhancing semiconductor material may be incorporated into one type of transistor only, for instance in P-channel transistors, while on the other hand corresponding material may not be incorporated in the active regions of the other type of transistor, while in other cases a substantially stress neutral semiconductor material may be incorporated, however, in a desired in situ doped manner so as to appropriately adjust a desired dopant profile in the corresponding active region.

It should be appreciated that, in some illustrative embodiments, the incorporation of a desired semiconductor material may be performed such that a desired overgrowth may be achieved, in which a raised drain and source configuration may be obtained in a highly controllable manner for any of the transistors 150A, 150B. In other cases, the corresponding materials may be incorporated, if required, without creating a pronounced surface topography and an appropriate conductive material for forming the raised drain and source areas may be provided in a later manufacturing stage.

Figure 1B:
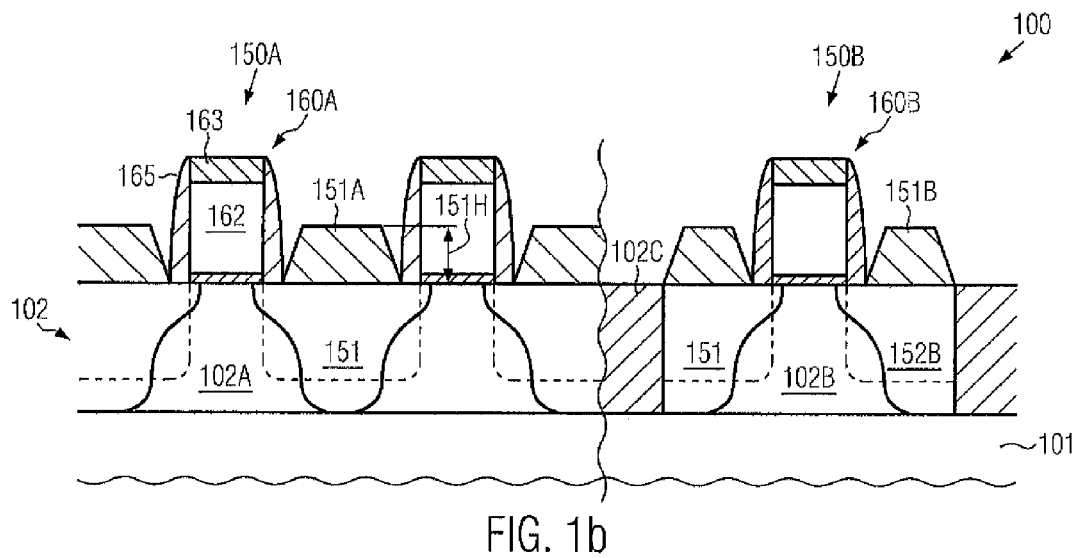

FIG. 1b schematically illustrates the semiconductor device 100 in a further advanced manufacturing stage. As shown, drain and source regions 151 may be formed in the active regions 102A, 102B, for instance by implantation techniques, by epitaxial growth techniques, a combination thereof and the like, depending on the overall configuration of the transistors 150A, 150B. It should be appreciated that, in some illustrative embodiments, as described above, the drain and source regions 151 may be formed in combination with the incorporation of an in situ doped semiconductor material, which may also result in certain strain conditions, as discussed above. In other illustrative embodiments, the drain and source regions 151 may be incorporated on the basis of other process techniques, such as ion implantation, based, for instance, on the sidewall spacer structure 165 in order to provide an appropriate offset. The spacer structure 165 may be provided on the basis of any appropriate dielectric material, such as silicon dioxide and the like, wherein, in some illustrative embodiments, the spacer structure 165 may have a high etch selectivity with respect to stop material that is to be provided in a later manufacturing stage. Moreover, the transistors 150A, 150B may comprise a raised drain and source configuration, i.e., a corresponding conductive material 151A may be provided in the transistors 150A and a conductive material 151B formed in the transistors 150B. Consequently, the materials 151A, 151B may be considered as a part of the drain and source regions 151 or may at least provide a very conductive section to the drain and source regions 151 within the active regions 102A, 102B, respectively. The conductive materials 151A, 151B, which may differ in material composition in some illustrative embodiments, may be substantially restricted to the dimensions of the active regions 102A, 102B and may have reduced lateral dimensions in order to avoid a shorting of the drain and source regions outside of the active regions 102A, 102B. The conductive materials 151A, 151B may both or individually represent a part of any semiconductor alloy, such as semiconductor alloy 152B, if provided, which may have been incorporated in an early manufacturing stage, as described above with reference to FIG. 1a. In other cases, any other appropriate conductive material may be used. For example, when forming one or both of the conductive materials 151A, 151B as a semiconductor material, the high dopant concentration may be incorporated upon depositing the semiconductor materials, thereby obtaining a desired high conductivity without requiring extensive implantation processes. For example, in P-channel transistors, a silicon/germanium alloy may be incorporated including a desired high dopant concentration, for instance in the form of boron, while a silicon material, a silicon/phosphorous alloy, a silicon/carbon alloy and the like may be used for N-channel transistors.

In other illustrative embodiments, the conductive materials 151A, 151B may comprise a metal component, such as cobalt and the like, which may, in some advantageous embodiment, be deposited on the basis of self-aligned electrochemical deposition techniques. The semiconductor device 100 as shown in FIG. 1b may be formed on the basis of process techniques in which the drain and source regions 151 may be implemented, for instance, on the basis of techniques described above with reference to FIG. 1a, on the basis of implantation processes or any combination thereof. Thereafter, the materials 151A, 151B may be formed, for instance, by epitaxial growth techniques when depositing a semiconductor or semiconductor alloy, possibly with an appropriately selected in situ dopant concentration, wherein, in some cases, a selective deposition behavior may be achieved, thereby avoiding undue material deposition outside of the active regions 102A, 102B. It should be appreciated that when different types of semiconductor materials have to be provided, a hard mask material may be used for covering one of the active regions 102A, 102B and epitaxially growing the desired semiconductor material on the exposed active region. Thereafter, the hard mask may be removed and a further hard mask may be formed so as to cover the previously exposed transistor and to form the other type of semiconductor material. In other illustrative embodiments, the selective epitaxial growth process may be performed so as to exhibit a self-limiting deposition behavior, thereby reducing the number of masking steps required. In still other illustrative embodiments, the materials 151A, 151B may be provided in the form of a semiconductor material having substantially the same composition so that a single deposition step may be applied, thereby providing for superior height uniformity in the transistors 150A, 150B.

In other illustrative embodiments, the materials 151A, 151B may be formed by electrochemical deposition techniques, for instance using exposed surface areas of the drain and source regions 151 as a catalyst material, for instance by providing therein a metal silicide and the like, thereby also accomplishing a self-aligned deposition. For example, cobalt may be efficiently deposited on a metal silicide on the basis of a well-established electroless plating technique. Thus, a height level 151H may be defined by the materials 151A, 151B, which in turn may thus be used for controlling a height reduction of the gate electrode structures 160A, 160B in a further advanced manufacturing stage.

Figure 1C:
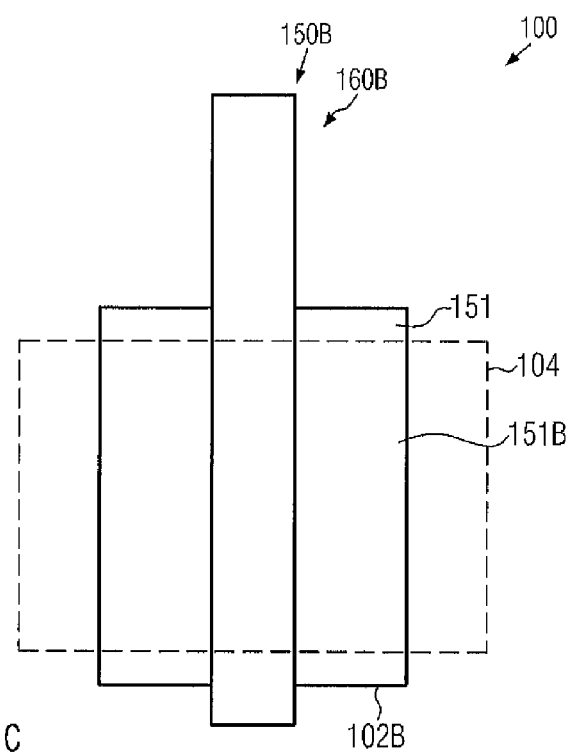
FIG. 1c schematically illustrates a top view of a portion of the semiconductor device of FIGS. 1a and 1b in illustrative embodiments in which the lateral extension of a conductive material of the raised drain and source areas may be restricted.

FIG. 1c schematically illustrates a top view of the device 100 wherein, for convenience, the active region 102B of the transistor 150B is illustrated only. In some cases, even when using a substantially self-aligned deposition technique, such as selective epitaxial growth techniques, electroless plating and the like, a reliable restriction of the conductive material, such as the material 151B, may be desirable, which may be accomplished by performing a patterning process on the basis of a mask 104, which may thus define, at least in one lateral direction, the actual extension of the conductive material 151B. For example, the mask 104 may have a size that is less than the dimension of the active region 102B, for instance along at least one lateral direction, for instance along a width direction of the active region 102B, which is to be understood as the vertical direction in FIG. 1c. In this manner, the probability of creating short circuits between the drain and source regions caused by the material 151B may be significantly reduced, for instance when a per se selected deposition technique may nevertheless result in a certain lateral growth. The mask 104 may be provided in the form of any appropriate mask material based on a substantially non-critical lithography process. Thereafter, an appropriate etch recipe may be applied so as to remove the material 151B selectively with respect to dielectric material and the like.

Figure 1D:
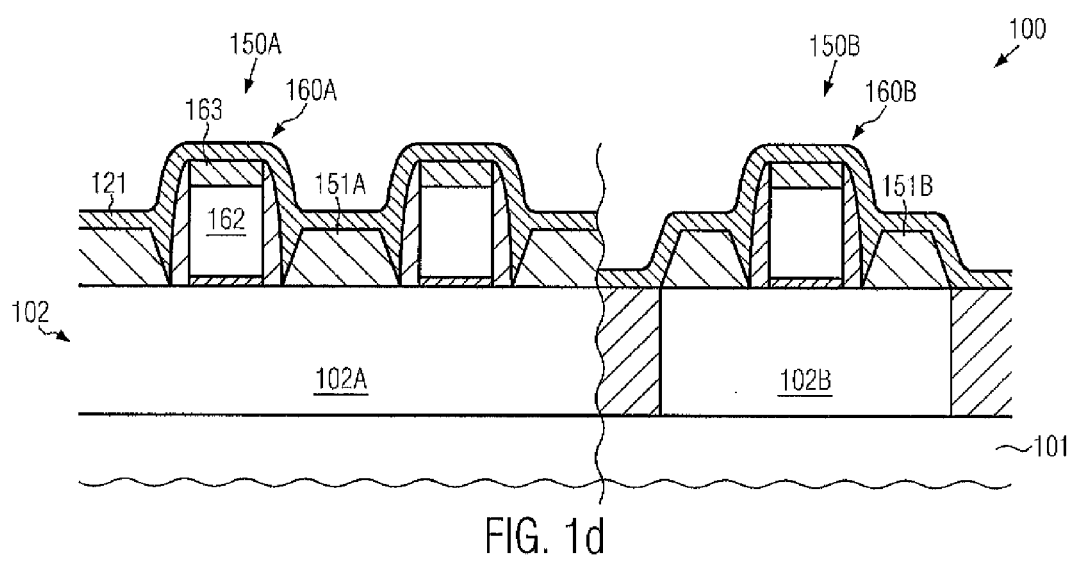
FIGS. 1d-1j schematically illustrate cross-sectional views of the semiconductor device in further advanced various manufacturing stages in performing a replacement gate approach upon using the raised drain and source configuration for controlling the final gate height and for providing superior process conditions for a subsequent patterning process for forming contact elements, according to illustrative embodiments.

FIG. 1d schematically illustrates the device 100 in a further advanced manufacturing stage. It should be appreciated that, for convenience, the drain and source regions are no longer illustrated in the figures. As shown, a dielectric stop layer 121, such as a silicon nitride material and the like, may be formed above the active regions 102A, 102B and, thus, above the gate electrode structures 160A, 160B. To this end, any well-established deposition technique may be applied, such as plasma enhanced chemical vapor deposition (CVD), thermally activated CVD and the like. The material 121 may be provided with a highly conformal deposition behavior, thereby also enabling an appropriate control of the layer thickness, in particular above the conductive materials 151A, 151B. For example, a thickness of the layer 121 above the materials 151A, 151B may be approximately 20 nm and less.

Figure 1E:
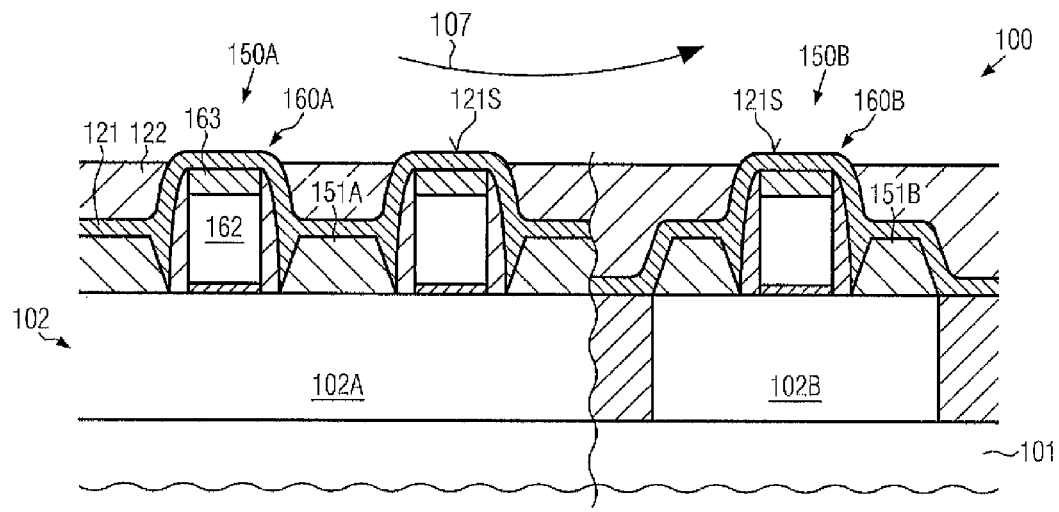

FIG. 1e schematically illustrates the device 100 in a further advanced manufacturing stage in which a further dielectric material 122, such as silicon dioxide or any other appropriate dielectric material, may be formed above the active regions 102A, 102B. To this end, any appropriate deposition technique may be applied, such as spin-on techniques, CVD and the like. After any optional low-temperature anneal treatments for adjusting the material characteristics of the material 122, a removal process 107 may be applied, for instance in the form of a chemical mechanical polishing (CMP) process, thereby finally exposing a top surface 121S of the material 121 above the gate electrode structures 160A, 160B. Consequently, the layer 121 may be used as an efficient stop layer for the process 107. A plurality of selective polishing recipes for removing silicon dioxide selectively with respect to silicon nitride are available.

Figure 1F:
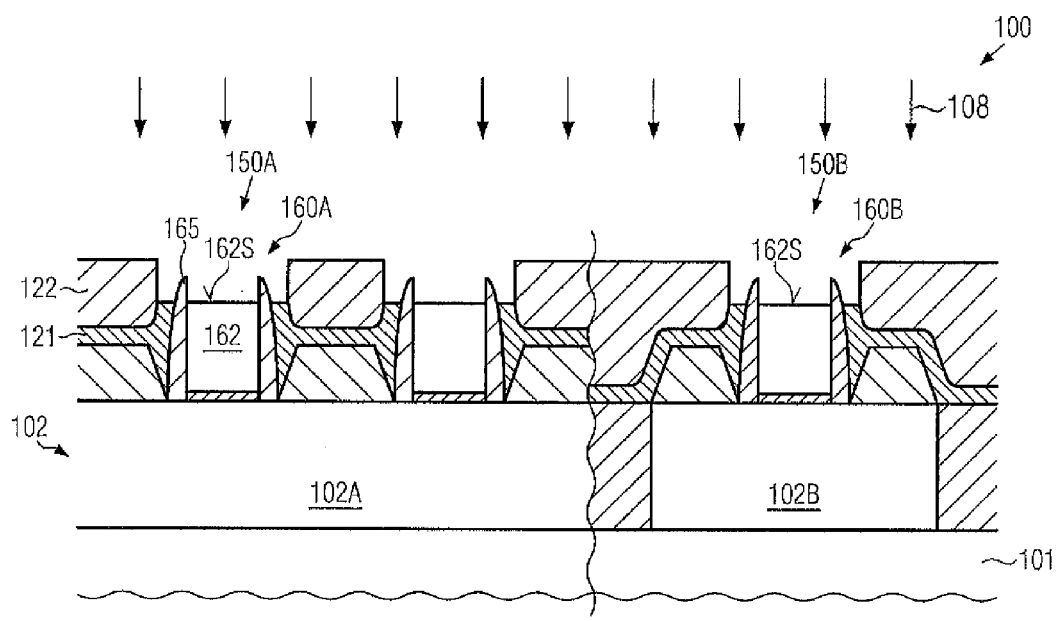

FIG. 1f schematically illustrates the device 100 during a further material removal process 108, in which the exposed portion of the layer 121 and the cap layers 163 (see FIG. 1e) may be removed selectively with respect to the material 122 and possibly selectively to the spacer structure 165. To this end, a plurality of plasma assisted etch recipes are available, for instance, for etching silicon nitride selectively with respect to silicon dioxide. Furthermore, during the removal process 108, a top surface 162S of the placeholder material 162 may also be exposed.

Figure 1G:
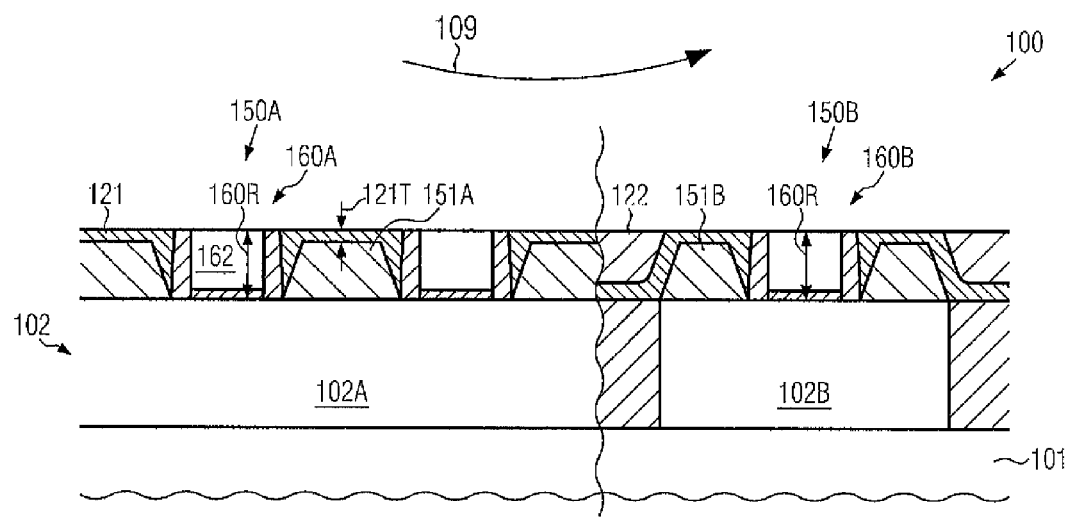

FIG. 1g schematically illustrates the semiconductor device 100 in a further advanced manufacturing stage in which a further removal process 109 may be applied, for instance, in the form of a CMP process, in which silicon dioxide and the placeholder material 162 may be efficiently removed, while the material 121 may be used as an efficient stop material. Consequently, during the process 109, the height of the gate electrode structures 160A, 160B may be efficiently reduced by using conductive materials 151A, 151B in combination with a remaining layer 121 for controlling the removal process 109 and thus for adjusting the reduced gate height 160R. Thus, in the manufacturing stage shown in FIG. 1g, the reduced gate height 160R may correspond to the height 151H (FIG. 1b) plus the remaining thickness 121T of the material 121, wherein the thickness 121T may be approximately 20 nm and significantly less so that the materials 151A, 151B and the gate electrode structures 160A, 160B may have a very similar height level, thereby enabling superior process conditions upon forming contact elements so as to connect to the materials 151A, 151B on the one hand, and to the gate electrode structures 160A, 160B on the other hand. It should be appreciated that any well-established CMP recipes may be used for the process 109.

Figure 1H:
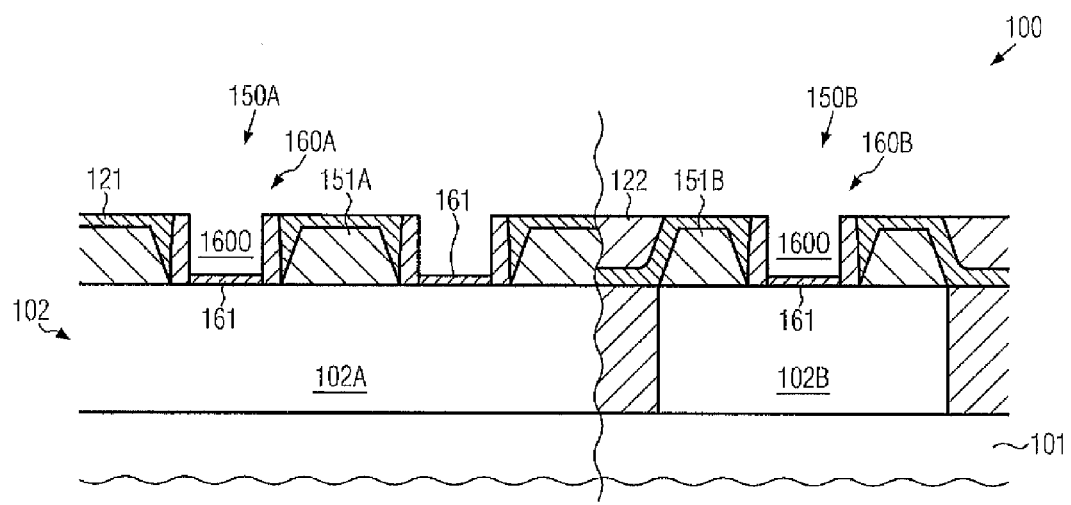

FIG. 1h schematically illustrates the device 100 after performing a selective etch process for removing the placeholder material of the gate electrode structures 160A, 160B, thereby forming respective gate openings 160O. During the highly selective etch process, for instance performed on the basis of TMAH (tetra methyl ammonium hydroxide), or any other highly selective plasma assisted or wet chemical etch recipe, the material 161 may act as an etch stop layer and may be subsequently removed, or at least partially removed, depending on the overall process strategy.

Figure 1I:
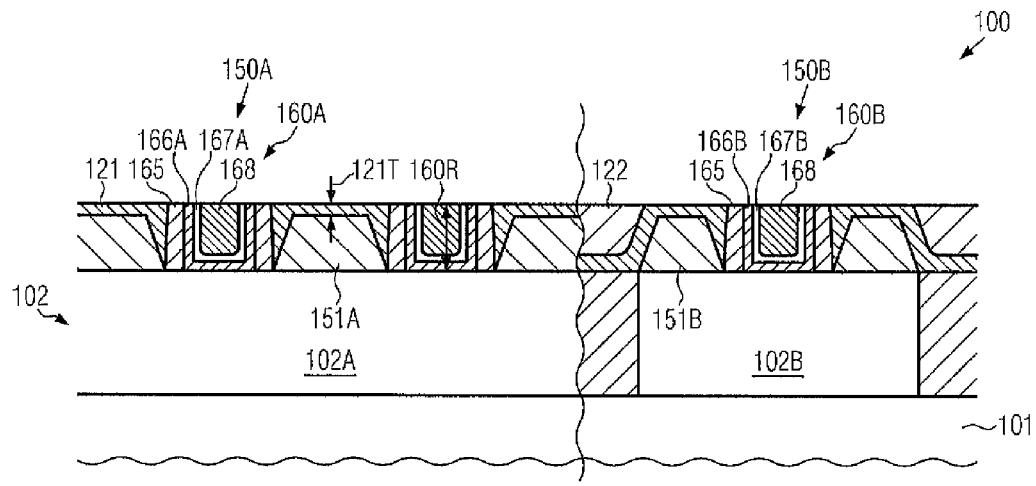

FIG. 1i schematically illustrates the device 100 in a further advanced manufacturing stage. As shown, a complex material system may be formed in the gate electrode structures 160A, 160B, which now represent high-k metal gate electrode structures. As shown, a gate dielectric material 166A, possibly in combination with a thin conventional dielectric material, at least at the surface of the active region 102A, may be provided in combination with an appropriate work function of the layer 167A in combination with a highly conductive electrode metal 168, such as aluminum, aluminum alloys and the like. Similarly, the gate electrode structure 160B may comprise a gate dielectric material 166B in combination with a work function metal layer system 167B and the highly conductive electrode metal 168. The complex material system may be incorporated by using well-established deposition and patterning strategies, possibly in combination with additional heat treatments so as to initiate a diffusion of a work function metal species, if required. Thereafter, any excess material may be removed, for instance by CMP, thereby providing the gate electrode structures 160A, 160B as electrically isolated entities. Consequently, also in this manufacturing phase, the height level of the gate electrode structures 160A, 160B is substantially determined by the materials 151A, 151B in combination with the layer 121. In this manufacturing stage, the actual contact level may be formed on the basis of superior process conditions, wherein, in particular, a contacting of the gate electrode structures 160A, 160B and of the drain and source regions may be accomplished on the basis of substantially the same height level.

Figure 1J:
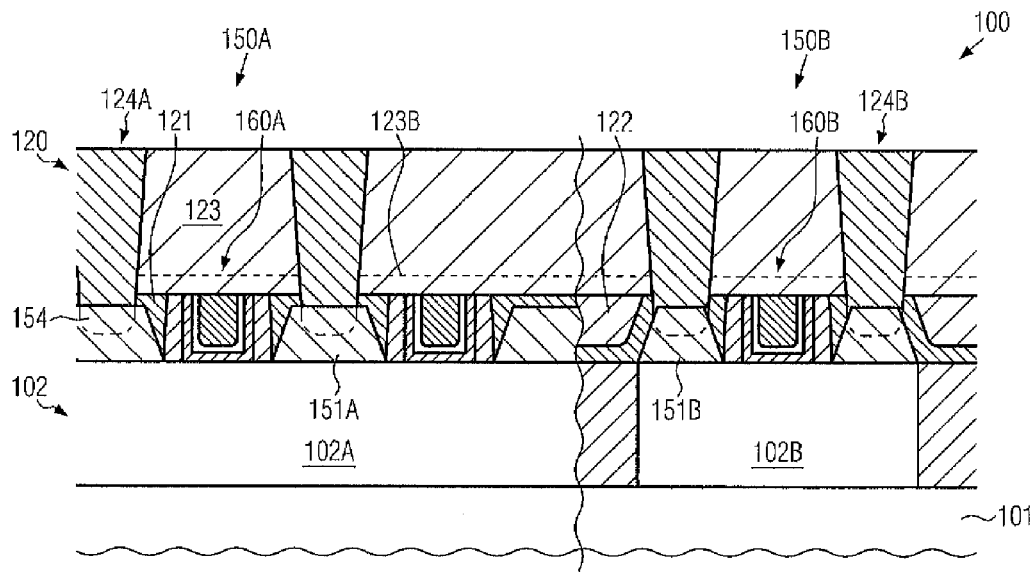

FIG. 1j schematically illustrates the semiconductor device 100 in a further advanced manufacturing stage. As shown, a contact level 120 may be provided and may comprise an interlayer dielectric material 123, such as silicon dioxide, possibly in combination with an additional material, such as an etch stop layer 123B, if required. Furthermore, contact elements 124A are formed within the dielectric material 123 so as to connect to the conductive material 151A, while contact elements 124B connect to the conductive material 151B. It should be appreciated that, in the cross-sectional view of FIG. 1j, any contact elements connecting to the gate electrode structures 160A, 160B are not shown. Moreover, in some illustrative embodiments, appropriate contact regions 154 may be formed in the conductive materials 151A, 151B, for instance in the form of a metal silicide, when the materials 151A, 151B comprise a significant amount of silicon.

The device 100 as shown in FIG. 1j may be formed on the basis of the following processes. Based on a substantially planar surface topography, the material 123, possibly in combination with the material 123B, may be deposited on the basis of any appropriate deposition technique and, thereafter, a patterning process may be applied, for instance, by applying a single lithography process and a single etch process in order to form contact openings so as to extend to the materials 151A, 151B and to the corresponding gate electrode structures. During the etch process, the remaining layer 121 may be used as an efficient etch stop material, while in other cases the optional etch stop material 123B may be efficiently used for controlling the etch process. Thereafter, any appropriate contact material may be deposited, for instance, in the form of well-established materials, such as tungsten, possibly in combination with barrier materials, while in other cases highly conductive materials, such as copper-containing materials, silver-containing materials and the like, may be used in combination with appropriate barrier materials. Thereafter, any excess material may be removed, for instance by CMP, thereby obtaining the contact elements 124A, 124B as electrically isolated elements.

In other illustrative embodiments, two lithography processes may be applied, for instance, for forming elongated contact elements extending perpendicular and parallel with respect to the gate electrode structures 160A, 160B, which may also be accomplished on the basis of appropriate lithography and masking strategies.

Figure 1K:
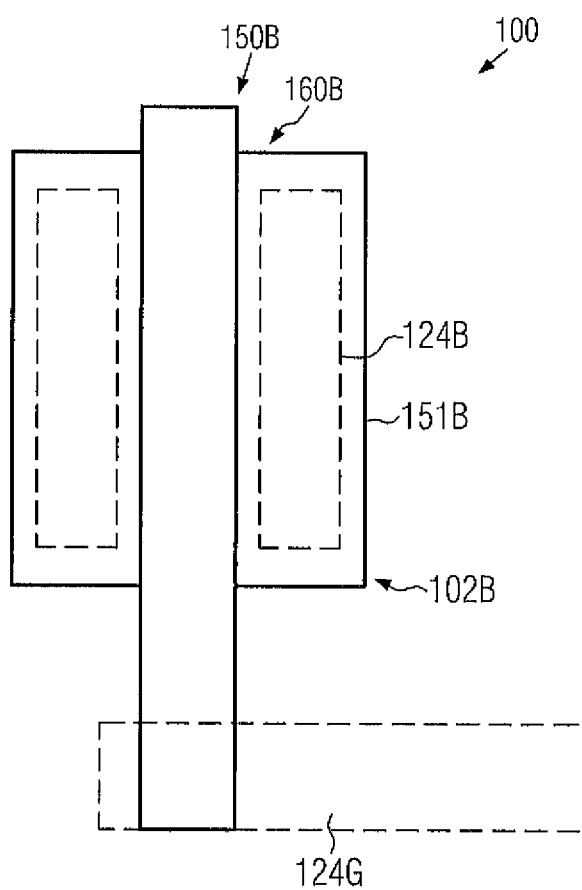
FIG. 1k schematically illustrates a top view of a portion of the semiconductor device in which a contact regime is illustrated in accordance with illustrative embodiments.

FIG. 1k schematically illustrates a top view of a portion of the device 100. For convenience, a contact layout may be shown for the transistor 150B only. As illustrated, the contact elements 124B may be provided, in this illustrative embodiment, as a substantially elongated feature which connects to the material 151B along a significant portion of the active region 102B. On the other hand, the gate electrode structure 160B may be contacted by means of a contact element 124G, which may also be provided in the form of an elongated contact element that extends perpendicularly to the gate electrode structure 160B and to the contact elements 124B. The contact elements 124B, 124G may be formed in a common lithography and patterning process due to the superior surface topography and the substantially similar height level of the material 151B and of the gate electrode structure 160B, as previously discussed. In other cases, a double exposure process may be applied, for instance, forming corresponding hard mask openings for the elements 124B and 124G in separate lithography steps. Moreover, It should be appreciated that the contact elements 124B, 124G may have any other configuration as required by the overall process strategy and the device requirements. Furthermore, as already discussed above with reference to FIG. 1c, the extension of the material 151B may be restricted within the active region 102B so as to enable a contacting of the gate electrode structure 160B even above the active region 102B, thereby reducing the overall dimensions of the contact level of the device 100.

As a result, the present disclosure provides semiconductor devices and manufacturing techniques in which substantially self-aligned contact areas in the form of a conductive material may be provided, which also results in superior surface topography upon forming the actual contact elements. Moreover, by means of the raised drain and source configuration, the final height of the high-k metal gate electrode structure in a replacement gate approach may be controlled with superior efficiency, thereby generally enabling a reduced gate height, which thus translates into a reduced parasitic capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a conductive material above an active region of a semiconductor device and laterally adjacent to and spaced apart from a placeholder gate electrode structure that is formed above said active region, said conductive material extending to a height level above said active region that is less than a height level of a top surface of said placeholder gate electrode structure;
performing a plurality of material removal processes in the presence of said conductive material so as to reduce a height of said placeholder gate electrode structure, wherein a top surface of a placeholder material of said placeholder gate electrode structure is exposed after at least a last one of said plurality of material removal processes; and
after performing said plurality of material removal processes, replacing said placeholder material at least with a metal-containing electrode material so as to form a high-k metal gate electrode structure.

2. The method of claim 1, further comprising forming a dielectric material above said high-k metal gate electrode structure and said conductive material and forming a contact element in said dielectric material so as to connect to said conductive material.

3. The method of claim 1, wherein forming said conductive material comprises forming said conductive material selectively on exposed areas of said active region.

4. The method of claim 1, wherein forming said conductive material comprises performing a patterning process on said as-formed conductive material so as to adjust lateral dimensions thereof.

5. The method of claim 1, wherein forming said conductive material comprises forming a semiconductor material.

6. The method of claim 5, wherein forming said semiconductor material comprises performing at least one selective epitaxial growth process.

7. The method of claim 1, further comprising forming a dielectric stop layer above said placeholder gate electrode structure and said conductive material prior to performing said plurality of material removal processes.

8. The method of claim 7, further comprising forming a dielectric fill material above said dielectric stop layer, wherein performing said plurality of material removal processes comprises exposing said stop layer selectively above said placeholder gate electrode structure and removing said exposed stop layer selectively to said dielectric fill material.

9. The method of claim 1, further comprising forming a second conductive material laterally adjacent to a second placeholder gate electrode structure that is formed on a second active region, wherein said second conductive material differs from said conductive material at least in material composition.

10. The method of claim 5, further comprising forming a metal silicide in a portion of said conductive material.

11. The method of claim 2, wherein forming said contact element comprises forming a contact opening in said dielectric material and forming at least one of a copper-containing material, an aluminum-containing material and a silver-containing material in said contact opening.

12. A method, comprising:
forming a first portion of a dielectric stop layer above raised drain and source areas and second portion of said dielectric stop layer above a placeholder gate electrode structure of a semiconductor device;
reducing a height of said placeholder gate electrode structure by using said first portion of said dielectric stop layer formed above said raised drain and source areas as a stop layer during a material removal process so as to adjust a final height of said placeholder gate electrode structure and to expose a top surface of a placeholder material thereof; and
replacing said placeholder material having said exposed surface with at least a conductive electrode material so as to form a high-k metal gate electrode structure.

13. The method of claim 12, further comprising forming a dielectric material above said high-k metal gate electrode structure and said raised drain and source areas and forming contact elements in said dielectric material that connect to said raised drain and source areas.

14. The method of claim 12, further comprising forming said raised drain and source areas by selectively depositing a semiconductor material.

15. The method of claim 12, wherein reducing a height of said placeholder gate electrode structure comprises forming a dielectric fill material above said stop layer, exposing said stop layer selectively above said placeholder gate electrode structure and removing said exposed stop layer.

16. The method of claim 14, wherein forming said raised drain and source areas comprises incorporating a portion of said semiconductor material in cavities formed in an active region of said semiconductor device.

17. The method of claim 12, wherein said material removal process comprises a chemical mechanical polishing (CMP) process and said stop layer is a CMP stop layer.

18. The method of claim 1, wherein, prior to performing said plurality of material removal processes, said conductive material extends to a first height level and said top surface of said placeholder gate electrode structure extends to a second height level, and wherein, after performing said plurality of material removal processes, said height of said gate electrode structure is reduced from said second height level to a third height level that is less than said second height level and at least as great as said first height level.

19. The method of claim 18, wherein reducing said height of said placeholder gate electrode structure from said second height level to said third height level comprises removing an upper portion of said placeholder material while leaving a lower portion of said placeholder material above said active region.

20. The method of claim 7, wherein a height level of said top surface of said placeholder material is substantially the same as or greater than a total height level of said conductive material plus a thickness of said dielectric stop layer after performing said plurality of material removal processes.

21. A method, comprising:
  forming a placeholder gate electrode structure comprising a placeholder material above an active region of a semiconductor device, an upper surface of said placeholder gate electrode structure extending to a first height level;
  forming a conductive material above said active region and laterally adjacent to said placeholder gate electrode structure, an upper surface of said conductive material extending to a second height level that is less than said first height level;
  performing a first material removal process to remove a first portion of said placeholder gate electrode structure so as to reduce a height thereof from said first height level to a third height level that is greater than said second height level;
  performing a second material removal process to remove a second portion of said placeholder gate electrode structure so as to further reduce said height thereof from said third height level to a fourth height level that is at least as great as said second height level and to expose said placeholder material;
  after performing said second material removal processing, forming a gate opening by removing said placeholder material; and
  forming at least a work function metal and conductive electrode metal in said gate opening.

22. The method of claim 21, further comprising, prior to performing said first material removal process, forming a dielectric layer above said conductive material and using said dielectric layer as a stop layer during said second material removal process so as to adjust said height of said placeholder gate electrode structure.

23. The method of claim 22, wherein said first material removal process comprises an etch process, said second material removal process comprises a chemical mechanical polishing (CMP) process, and stop layer is a CMP stop layer.

* * * * *